United States Patent
Götzen

(10) Patent No.: US 6,805,829 B2
(45) Date of Patent: Oct. 19, 2004

(54) METHOD FOR PRODUCTION OF THREE-DIMENSIONALLY ARRANGED CONDUCTING AND CONNECTING STRUCTURES FOR VOLUMETRIC AND ENERGY FLOWS

(76) Inventor: Reiner Götzen, Dorfstrasse 68, D-47239 Duisburg (DE)

( * ) Notice: Subject to any disclaimer, the term of this patent is extended or adjusted under 35 U.S.C. 154(b) by 308 days.

(21) Appl. No.: 09/914,585

(22) PCT Filed: Dec. 8, 2000

(86) PCT No.: PCT/DE00/04393

§ 371 (c)(1),
(2), (4) Date: Aug. 29, 2001

(87) PCT Pub. No.: WO01/50198

PCT Pub. Date: Jul. 12, 2001

(65) Prior Publication Data

US 2002/0125612 A1 Sep. 12, 2002

(30) Foreign Application Priority Data

Dec. 31, 1999 (DE) .......................................... 199 64 099

(51) Int. Cl.⁷ ......................... B29C 35/08; B29C 41/02; B29C 41/20; B29C 70/88
(52) U.S. Cl. ....................... 264/401; 264/236; 264/255; 264/259; 264/272.17; 264/317
(58) Field of Search ................................ 264/259, 236, 264/255, 272.17, 308, 317, 401

(56) References Cited

U.S. PATENT DOCUMENTS

| 5,173,220 A | | 12/1992 | Reiff et al. |
| 5,264,061 A | * | 11/1993 | Juskey et al. ........... 264/401 X |
| 5,398,193 A | | 3/1995 | deAngelis |
| 6,549,821 B1 | * | 4/2003 | Farnworth et al. .. 264/272.17 X |

FOREIGN PATENT DOCUMENTS

| DE | 44 20 996 A1 | 1/1996 |
| EP | 0 523 981 A1 | 1/1993 |
| EP | 0 581 445 A1 | 2/1994 |

OTHER PUBLICATIONS

Abstract of Japan 01232024 (Sep. 18, 1989).

* cited by examiner

Primary Examiner—Leo B. Tentoni
(74) Attorney, Agent, or Firm—Collard & Roe, P.C.

(57) ABSTRACT

The invention relates to a method for production of three-dimensionally arranged conducting and connecting structures for volumetric and energy flows. Various light-setting materials are used for the production of the layers. Upon exchanging the materials, those layer regions in which no setting occurred during the preceding setting process, are also filled with new material, such that, in the subsequent setting process, not only is the upper layer linked to the one lying directly beneath it, but also material of the upper layer is connected to the material of a layer lying below the penultimate layer. It is thus possible, within the layer sequence, to connect a structure with varying properties from layer to layer.

3 Claims, No Drawings

METHOD FOR PRODUCTION OF THREE-DIMENSIONALLY ARRANGED CONDUCTING AND CONNECTING STRUCTURES FOR VOLUMETRIC AND ENERGY FLOWS

Applicant claims priority under 35 U.S.C. §119 of German Application No. 199 64 099.8, filed on Dec. 31, 1999. Applicant also claims priority under 35 U.S.C. §365 of PCT/DE00/04393, filed on Dec. 8, 2000. The international application under PCT article 21(2) was not published in English.

1. Field of the Invention

The present invention relates to a method for producing three-dimensionally arranged conducting and connecting structures for volumetric and energy flows. The volumetric flows may be gaseous, liquid or solid, or may consist of a mixture of said states of aggregation. The energy flows may be of an acoustic, electric, magnetic or electromagnetic nature.

2. The Prior Art

Such volumetric and energy flows are realized at the present time with the help of many different technologies, as a rule. Conductor paths and bond wires are the most frequently employed paths of transportation in the field of microsystem technology. In addition to hollow conductors, glass fibers are used for transporting electromagnetic energies as well. Volumetric flows are realized by way of channels, hoses and pipelines. With increasing miniaturization, it is possible only with great difficulty to still combine such conducting and connecting elements.

SUNMARY OF THE INVENTION

The problem is solved by the invention by using a structured, layered build-up. Methods for building up layers are known from the field of microtechnology. DE-PS 44 20 996, for example, describes a method in connection with which a small amount of the light-setting plastic is maintained between two parallel boards due to the surface tension, with at least one of said boards being permeable to electromagnetic waves. The surface of the plastic liquid located below the board that is permeable to electromagnetic waves, is cured, for example by means of a laser beam that is guided across the surface according to a 3-layer model of the structure to be generated. The model is stored in a connected computer. The laser light cures the plastic liquid layer by layer in accordance with the 3D layer model, whereby the spacing of the boards is increased in each step by one layer thickness, so that fresh plastic material can continue to flow into the intermediate space being created between the cured layer and the board solely on account of its surface tension. Structures can be produced in this way with high accuracy in the micrometer range.

Said technology is employed by the invention.

DETAILED DESCRIPTION OF PREFERRED EMBODINENTS

Different light-setting materials are employed by the invention for producing the layers. Such materials may have all kinds of different physical, chemical and biological properties. For example, the materials may be electrically conductive or electrically insulating, and they may have different optical refraction indices. When the materials are exchanged, the layer segments where no setting occurred in the preceding setting process, are filled with new material, so that in the subsequent setting process, not only the uppermost layer is connected to the one lying directly underneath it, but material of the uppermost layer is connected also to the material of a layer lying underneath the second-last layer. Thus it is possible within the layer sequence to connect a structure with varying material properties from layer to layer. For volumetric transport, these are uncured areas which, following setting and the flushing process, are available as channels. Said channels can be used also as hollow conductors for high frequency application if the walls of the channels are produced from material that has properties suitable for said purpose.

Furthermore, light-conducting structures can be produced with materials with different refractive indices. Such light-conducting structures can be employed in conjunction with light transistors (key word: light switches light) for producing optical integrated circuits.

Conventional integrated circuits (IC's) can be connected to each other in this manner as well because if an IC has been integrated in a cavity underneath the last surface, it is possible to produce via the connections (pads) a channel with conductive material that can then be extended up to another IC, or also to plug connectors that have been produced in this manner.

In accordance with a preferred embodiment, a structured layer is generated by structured prefabrication of a liquid, light-setting material with selected physical, chemical or biological properties. The structured layer is cleaned of the uncured material by means of a flushing process, filled with liquid, light-setting material with other physical, chemical or biological properties, and covered with a defined layer thickness according to DE-PS 44 20 996. Areas of the first layer and the new layer are cured in a structured manner by structured solidification. The structured layers are cleaned of uncured material of the last structuring by means of a flushing process, filled with liquid, light-setting material with other physical, chemical, and biological properties, and covered with a defined layer thickness, according to DE-PS 44 20 996. Areas of the second layer and the new layer are cured in a structured manner by structured solidification, generating in this manner a connection of materials with the same physical, chemical, or biological properties, or an insulation of these materials. The structured layers are cleaned of the uncured materials of the last structuring by means of a flushing process. Areas not filled with material are fitted with electronic, mechanical, optical, or chemical components according to the system to be produced. The structured layers and the components are filled with liquid, light-setting material with other physical, chemical, and biological properties, and covered with a defined layer thickness according to DE-PS 44 20 996. Areas of the second-last layer and the new layer are cured in a structured manner, by structured solidification, generating in this manner a connection of materials and components with the same physical, chemical, or biological properties, or an insulation of such materials and components.

Several electronic, mechanical, chemical or biological/electrical components may be connected to each other in accordance with the method. The connections between the components and the environment of the system can also be used for volumetric and energy flows.

What is claimed is:

1. A method for producing three-dimensionally arranged conducting and connecting structures whereby different light-setting materials are employed, which comprises the following method steps:
    (a) generating a structured first layer by structured prefabrication of a liquid, light-setting material having selected physical chemical or biological properties;

(b) cleaning the structured first layer of uncured material by means of a flushing process, filling the structured layer with liquid, light-setting material having other physical, chemical, or biological properties, and covering the filled structured layer with a new layer having a defined thickness;

(c) curing areas of the new layer in a structured manner as necessary;

(d) cleaning all uncured regions of the structured layers by means of a flushing process, subsequently filling areas freed of light-setting material with light-setting material having different physical, chemical, and biological properties, and covering the filled-up areas with a second layer of light-setting, liquid material having a defined thickness;

(e) curing areas of the filled-up area of the second layer and in the new layer by structured solidification to generate a connection of material having the same physical, chemical, or biological properties, or an insulation of said materials;

(f) removing uncured material of the last structuring by means of a flushing process;

(g) fitting areas not filled with material with electronic, mechanical, optical, or chemical components according to the system to be produced;

(h) filling the structured layers and the components with liquid, light-setting material having other physical, chemical, and biological properties, covering the filled layers with a layer of liquid, light-setting material having a defined thickness and curing the areas in a structured manner to generate a connection of materials and components having the same physical, chemical, or biological properties, or an insulation of such materials and components as well as a connection between the components;

(i) repeating steps (a) to (h) until a three-dimensional structure has been built up, whereby each of said layers is generated with a small amount of light-setting plastic between two plane-parallel plates, at least one of which is permeable by electromagnetic waves, the small amount of the light-setting plastic being held in place by surface tension, whereby the thin layer is exposed by means of the electromagnetic waves, using a three-dimensional layer model of the structure to be generated, built up layer by layer, whereby this model is stored in the memory of a computer and the electromagnetic waves cure layer by layer at the exposed locations, in structured manner, using this model, whereby the distance between the plates is increased at every step, in accordance with the layer thickness, so that fresh plastic material can flow into the interstice.

2. The method according to claim 1, wherein several electronic, mechanical optical, or chemical components are connected to each other.

3. The method according to claim 1, wherein the connections between the components and the environment of the system can be used for volumetric and energy flows.

* * * * *

UNITED STATES PATENT AND TRADEMARK OFFICE
CERTIFICATE OF CORRECTION

PATENT NO.   : 6,805,829 B2
DATED        : October 19, 2004
INVENTOR(S)  : Götzen It is certified that error appears in the above-identified patent and that said Letters Patent is hereby corrected as shown below:

Column 2,
Line 67, please change "physical chemical" to read -- physical, chemical, --.

Column 4,
Line 1, please change "thickness and" to read -- thickness, and --.
Line 5, please change "components as" to read -- components, as --.
Line 24, please change "mechanical optical," to read -- mechanical, optical, --.

Signed and Sealed this

Twenty-fifth Day of January, 2005

JON W. DUDAS
*Director of the United States Patent and Trademark Office*